(12) United States Patent
Kim et al.

(10) Patent No.: US 7,938,308 B1
(45) Date of Patent: May 10, 2011

(54) WIRE BONDER FOR IMPROVED BONDABILITY OF A CONDUCTIVE WIRE AND METHOD THEREFOR

(75) Inventors: Joon Su Kim, Seoul (KR); Mun Gil Ho, Seoul (KR); Yong Suk Yang, Gyeonggi-do (KR); Jung Soo Park, Seoul (KR); Bong Chan Kim, Gyeonggi-do (KR)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 12/429,448

(22) Filed: Apr. 24, 2009

(51) Int. Cl.
  *B23K 37/00* (2006.01)
  *B23K 20/14* (2006.01)
(52) U.S. Cl. ..... 228/4.5; 228/180.5; 228/42; 219/85.16; 219/85.18; 219/56.1

(58) Field of Classification Search .................. 228/4.5, 228/180.5, 42; 219/56.1, 85.16, 85.18
See application file for complete search history.

(56) References Cited

U.S. PATENT DOCUMENTS 4,976,393 A * 12/1990 Nakajima et al. ............. 228/111
7,628,307 B2 * 12/2009 Wong et al. ................... 228/4.5

FOREIGN PATENT DOCUMENTS

| JP | 63111635 A | * | 5/1988 |
| JP | 02133933 A | * | 5/1990 |
| JP | 05109808 A | * | 4/1993 |

* cited by examiner

*Primary Examiner* — Jessica L Ward
*Assistant Examiner* — Devang R Patel
(74) *Attorney, Agent, or Firm* — Weiss & Moy, P.C.

(57) ABSTRACT

A wire bonder has a capillary through which a wire passes. A discharge tip is positioned near a bottom section of the capillary and provides a flame to a distal end of the wire. A gas diffuser is positioned beside the capillary to diffuse a heated gas to the distal end of the wire.

15 Claims, 8 Drawing Sheets

WIRE BONDER FOR IMPROVED BONDABILITY OF A CONDUCTIVE WIRE AND METHOD THEREFOR

FIELD OF THE INVENTION

This invention relates to wire bonder and, more specifically, to a wire bonder having a gas diffuser which reduces the hardness of a free air ball of a conductive wire in order to avoid damage to a bond pad of a semiconductor device and or a circuit pattern of a circuit board and to achieve improved bondability of the conductive wire.

BACKGROUND OF THE INVENTION

Generally, a semiconductor package is fabricated by attaching a semiconductor die to a circuit board (die bonding). The circuit board and the semiconductor die may then be electrically connected. In accordance with one method, conductive wires (wire bonding) may be used to electrically connect the circuit board and the semiconductor die. The semiconductor die and the conductive wires may then be encapsulated by an encapsulant (encapsulation).

The wire bonding process may includes the following steps: creating a free air ball (FAB) at one end of a conductive wire protruding downwardly through a lower end of a capillary using an electric flame-off (ER)) tip; moving the capillary toward a bond pad of a semiconductor die and primarily bonding the FAB to the bond pad (ball bonding); and moving the capillary toward a pattern of a circuit board and secondarily bonding the distal end of the conductive wire to the pattern (stitch bonding).

The conductive wire may be made of gold. In some cases, the gold wire is currently replaced by a cheaper copper wire. Since the Vickers hardness of the copper wire and its FAB is relatively high compared to that of the gold wire and its FAB, the use of the copper wire increases the probability of damage to the bond pad of the semiconductor die. That is, the bond pad is apt to crack when the relatively hard FAB of the copper wire is brought into close contact with the bond pad. Particularly, when the copper wire is applied to a low-dielectric constant (k) semiconductor device, weak active regions of the semiconductor device may lead to damage or cracking of the semiconductor device. Although the price of a copper wire is about one hundredth of that of a gold wire, the relatively high hardness of the copper wire increases the number of defects during wire bonding.

Therefore, a need existed to provide a system and method to overcome the above problem. The system and method would provide a wire bonder which reduces the hardness of a free air ball of a conductive wire.

SUMMARY OF THE INVENTION

A wire bonder has a capillary through which a wire passes. A discharge tip is positioned near a bottom section of the capillary and provides a flame to a distal end of the wire. A gas diffuser is positioned beside the capillary to diffuse a heated gas to the distal end of the wire.

A wire bonding method comprises: diffusing a heated gas to a conductive wire positioned at a lower end of a capillary; and providing an electric flame to a distal end of the conductive wire to create a free air ball.

A wire bonder has a capillary through which a conductive wire passes. A heater is positioned above the capillary to heat the conductive wire.

The present invention is best understood by reference to the following detailed description when read in conjunction with the accompanying drawings.

BRIEF DESCRIPTION OF THE DRAWINGS

Common reference numerals are used throughout the drawings and detailed description to indicate like elements.

DETAILED DESCRIPTION

Figure 1:
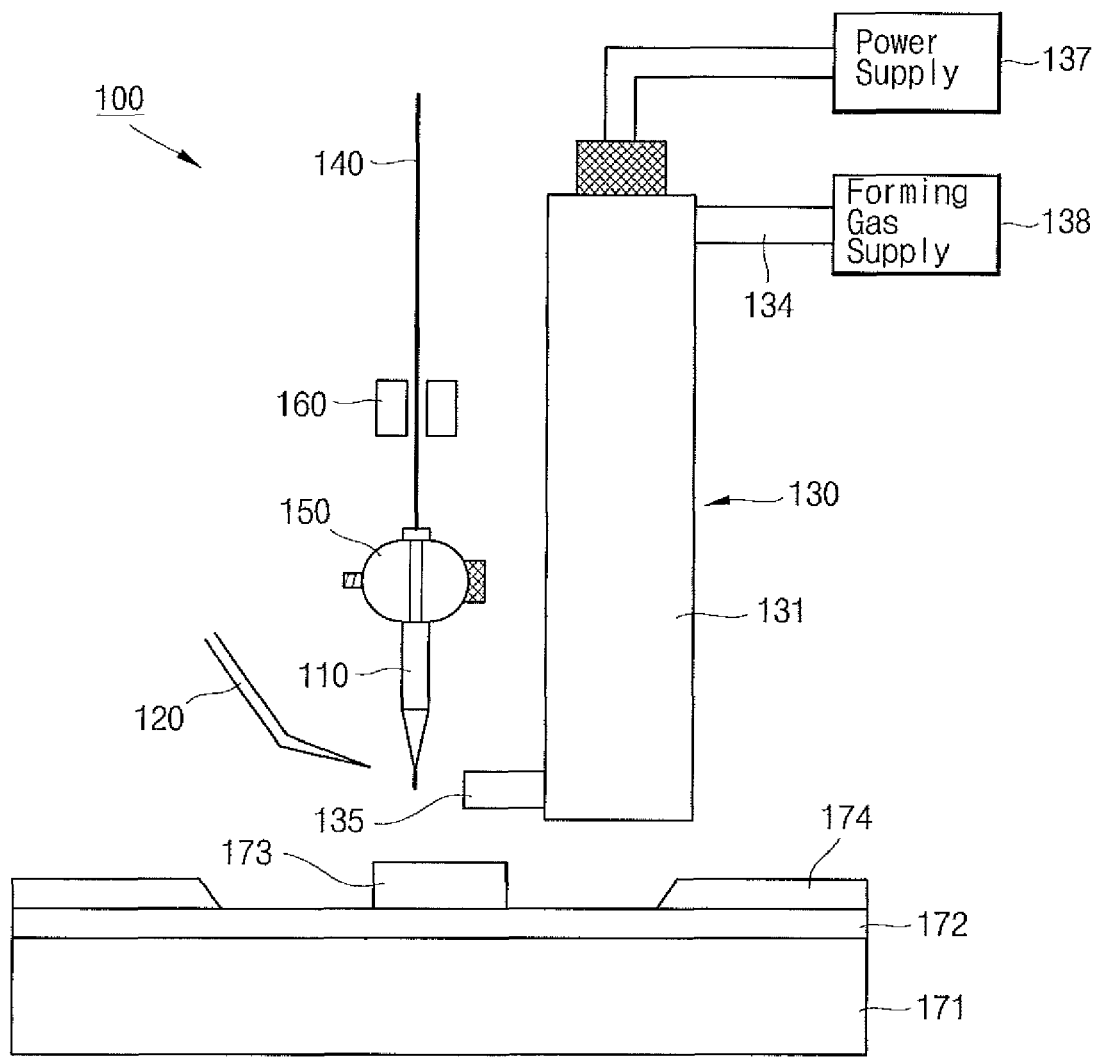
FIG. 1 is a schematic view illustrating the construction of a wire bonder according to an embodiment of the present invention.

Referring to FIG. 1, a schematic view of a wire bonder 100 according to one embodiment of the present invention is shown. As illustrated in FIG. 1, the wire bonder 100 comprises a capillary 110, an electric flame-off tip 120, and a gas diffuser 130.

The capillary 110 has a through-hole therein through which a conductive wire 140 passes. A transducer 150 is coupled to the capillary 110 to deliver ultrasonic energy to the capillary 110. A clamp 160 is positioned above the capillary 110 to clamp or unclamp the conductive wire 140 during wire bonding.

A heater block 171 is installed below the capillary 110. A circuit board 172 is securely mounted on the heater block 171, and a semiconductor die 173 is attached to the circuit board 172. The heater block 171 provides heat to a free air ball to be created at the distal end of the conductive wire 140. The circuit board 172 is brought into close contact with the heater block 171 by a clamp 174.

The electric flame-off tip 120 is installed beside the capillary 110. The electric flame-off tip 120 provides an electric flame to the distal end of the conductive wire 140 positioned at the lower end of the capillary 110 to create a free air ball. That is, the electric flame-off tip 120 induces the creation of a free air ball at the distal end of the conductive wire 140 to enable ball bonding of the conductive wire 140.

The gas diffuser 130 is installed beside the capillary 110 opposite to the electric flame-off tip 120. The gas diffuser 130 supplies a hot forming gas to the conductive wire 140 during the wire bonding process. In accordance with one embodiment, the gas diffuser 130 supplies a hot forming gas around 25° C.-300° C. to the conductive wire 140. If the temperature of the hot forming gas is lower than 25° C., a decrease in the hardness of a free air ball of the conductive wire 140 is insufficient and an improvement in the bondability of the conductive wire 140 is not significant. Meanwhile, a temperature higher than 300° C. in the present embodiment is substantially difficult to achieve in view of the characteristics of a heater, which will be described below.

In accordance with one embodiment, the conductive wire 140 may be made of a conductive material selected from, but not limited to, copper, gold, aluminum and equivalents thereof. The forming gas may be selected from nitrogen, hydrogen, air, mixtures thereof and equivalents thereof, but is not limited thereto. The listing of the above is given as an example and should not be seen to limit the scope of the present invention.

In the present embodiment, the hot forming gas is diffused from the gas diffuser 130 to the free air ball of the conductive wire 140 at the lower end of the capillary 110 to reduce the hardness of the free air ball. Therefore, the wire bonder can avoid damage to a bond pad of the semiconductor die 173 or a circuit pattern of the circuit board 172 and can achieve improved bondability of the conductive wire 140.

In addition, direct supply of the hot forming gas to the free air ball of the conductive wire 140 eliminates the need for an excessive increase in the temperature of the heater block 171. That is, there is no need for raising the temperature of the heater block 171 to heat the free air ball of the conductive wire 140. Excessive heating of the heater block 171 has a bad influence on the circuit board 172 or the semiconductor die 173.

Figure 2:
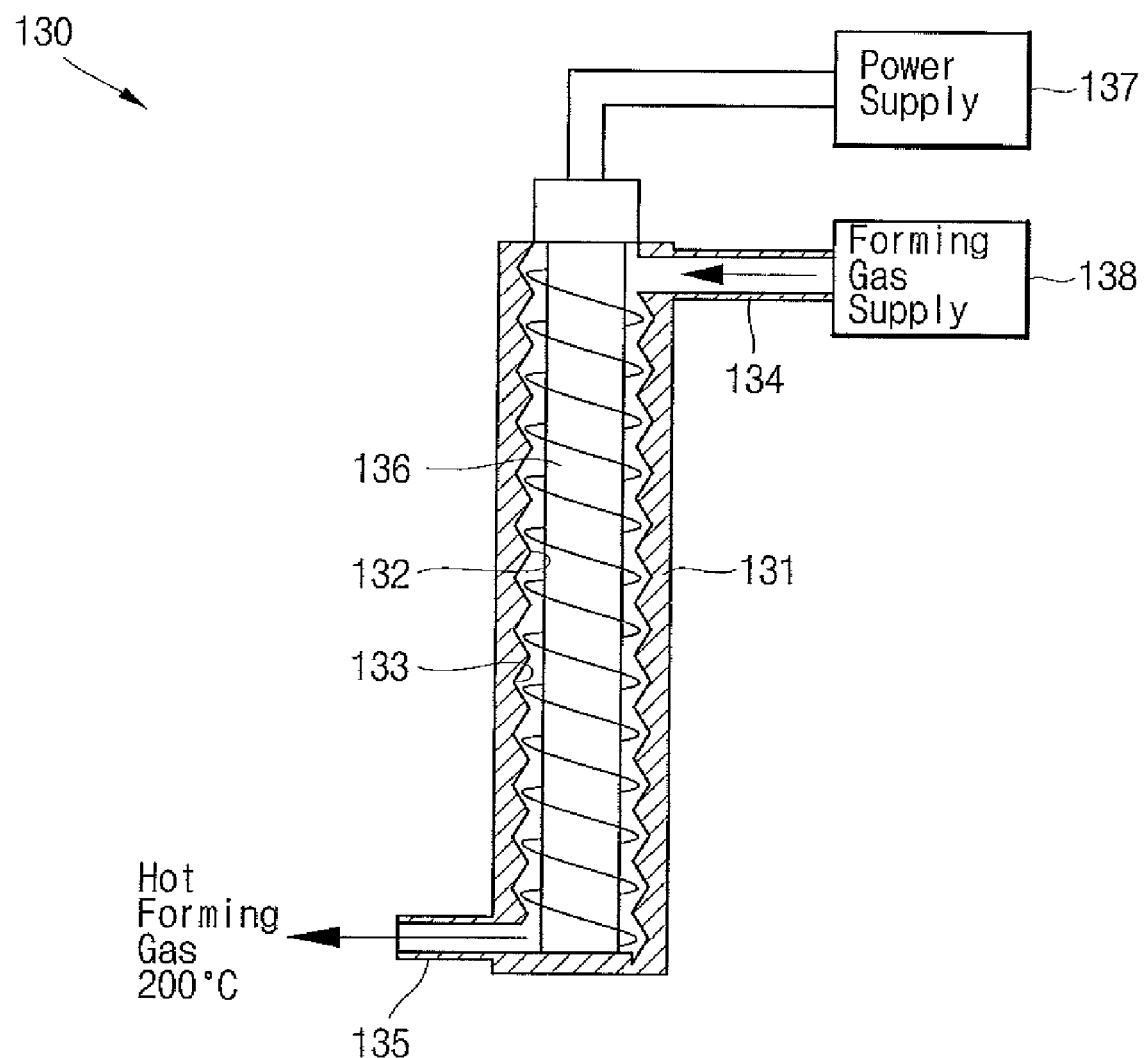
FIG. 2 is a schematic cross-sectional view illustrating a hot gas diffuser of a wire bonder according to the present invention.

Referring to FIG. 2, a schematic cross-sectional view of a hot gas diffuser 130 of a wire bonder according to one embodiment is shown. As illustrated in FIG. 2, the gas diffuser 130 includes a body 131, a heater 136, a power supply 137, and a forming gas supply 138.

The body 131 has an inner diameter surface 132 so as to define a space therein along the lengthwise direction thereof, a forming gas inlet port 134 in flow communication with the space defined by the inner diameter surface 132 at an upper end thereof, and a forming gas outlet port 135 in flow communication with the space defined by the inner diameter surface 132 at a lower end thereof. In accordance with one embodiment, the body 131 has an inner diameter surface 132 that defines a channel formed in an interior of and running a length of the body 131.

A helical groove 133 is formed extending from the forming gas inlet port 134 to the forming gas outlet port 135 on the inner diameter surface 132 of the body 131. With this configuration, a forming gas is introduced into the body 131 through the forming gas inlet port 134, flows downwardly along the groove 133 on the inner diameter surface 132 to reach the forming gas outlet port 135, and is sprayed out through the forming gas outlet port 135. That is, the helical groove 133 serves to allow the forming gas to stay in the space of the body 131 as long as possible.

The heater 136 is inserted into the space defined by the inner diameter surface 132 of the body 131. That is, the heater 136 is inserted into the space along the lengthwise direction of the body 131. A gap is formed between the heater 136 and the inner diameter surface 132 of the body 131 to allow the forming gas to flow downwardly along the helical groove 133. The heater 136 may take on a plurality of different configurations. There is no restriction on the structure and shape of the heater 136. For example, the heater 136 may consist of a heating coil and a ceramic material surrounding the heating coil, and may be in the shape of a bar. The forming gas can be typically heated to 25-300° C. by the heater 136. As a result, the temperature of the hot forming gas sprayed through the periphery of the heater 136 reaches 25-300° C.

The power supply 137 applies power to the heater 136. The power supply 137 may be a direct or alternating current power supply.

The forming gas supply 138 is connected to the forming gas inlet port 134 of the body 131 to supply a forming gas at constant flow and pressure to the body 131. The forming gas supplied from the forming gas supply 138 may be at different temperatures (including room temperature).

Due to this construction, the forming gas supplied from the forming gas supply 138 is heated to around 25-300° C. in the gas diffuser 130. The hot forming gas is sprayed toward the free air ball of the conductive wire 140 (FIG. 1) at the lower end of the capillary 110 (FIG. 1).

The heating and spraying of the forming gas are explained in more detail below. First, a forming gas at room temperature is introduced into the body 131 through the forming gas inlet port 134 of the body 131. Then, the heater 136 is operated by power applied from the power supply 137. The forming gas introduced into the body 131 is heated to about 25-300° C. by the heater 136 while flowing downwardly along the helical groove 130 formed on the inner diameter surface 132. Finally, the hot forming gas is sprayed out through the forming gas outlet port 135 of the body 131.

Figure 3:
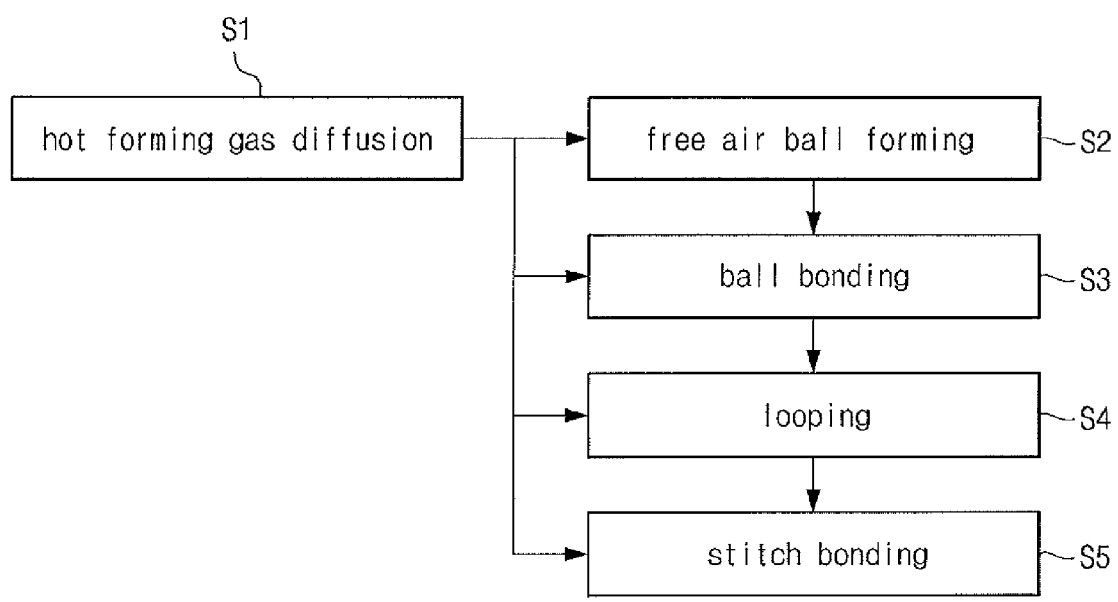
FIG. 3 is a flow chart illustrating a wire bonding method of the present invention.

Referring to FIG. 3, a flow chart of a wire bonding method of the present invention is shown. As illustrated in FIG. 3, the wire bonding method of the present invention comprises the following steps: diffusion of a hot forming gas (S1), formation of a free air ball (S2), ball bonding (S3), looping (S4) and stitch bonding (S5).

Figure 4A:
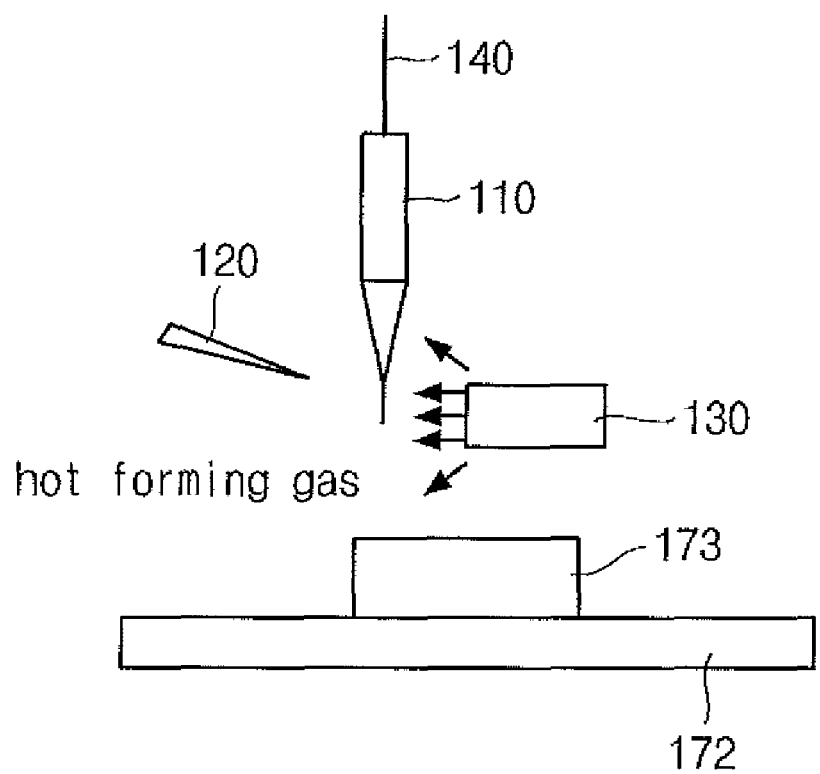
FIGS. 4A through 4E are schematic views sequentially illustrating the individual steps of a wire bonding method according to the present invention.

Referring to FIGS. 4A through 4E, there are sequentially illustrated schematic views for explaining the individual steps of the wire bonding method according to the present invention. As illustrated in FIG. 4A, and in step S1 of FIG. 3, a hot forming gas is diffused to the conductive wire 140 positioned at the lower end of the capillary 110, through which the conductive wire 140 passes. In accordance with one embodiment, a hot forming gas at 25° C.-300° C. is diffused to the conductive wire 140 by heating a forming gas in the gas diffuser 130.

In the case where the conductive wire 140 is made of copper or aluminum, nitrogen, or a mixed gas of nitrogen and hydrogen gases is desirable as the hot forming gas. The reason for the use of the nitrogen/hydrogen mixed gas is because the nitrogen gas protects a free air ball from oxidation and the hydrogen gas reduces the free air ball while protecting the free air ball from oxidation. In accordance with one embodiment, the nitrogen and hydrogen gases are substantially mixed in a ratio of 95:5.

Alternatively, in the case where the conductive wire 140 is made of gold, nitrogen or air is desirable as the hot forming gas. That is, since the free air ball of the gold wire does not substantially undergo oxidation, the use of hydrogen gas as the hot forming gas is excluded. Further, the hot forming gas may be continuously diffused to the conductive wire 140 without being stopped throughout steps S2, S3, S4 and S5 of FIG. 3.

Figure 4B:
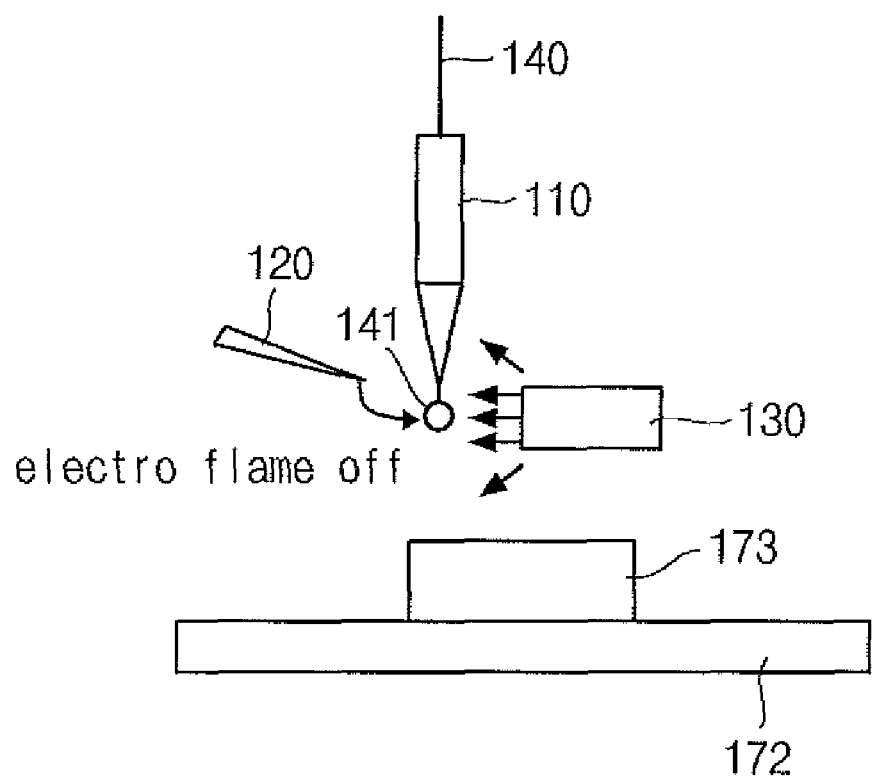

As illustrated in FIG. 4B, and in step S2 of FIG. 3, the electric flame-off tip 120 provides an electric flame to the distal end of the conductive wire 140 positioned at the lower end of the capillary 110, through which the conductive wire 140 passes, to create a free air ball 141. That is, the free air ball 141 is created by applying power to the electric flame-off tip 120 to deliver a flame from the electric flame-off tip 120 to the distal end of the conductive wire 140 positioned at the lower end of the capillary 110. It is known that the free air ball 141 is created at a temperature of about 1,000° C. At this time, the hot forming gas is still diffused to the free air ball 141 so as to maintain the free air ball 141 at the same temperature as the hot forming gas.

Figure 4C:
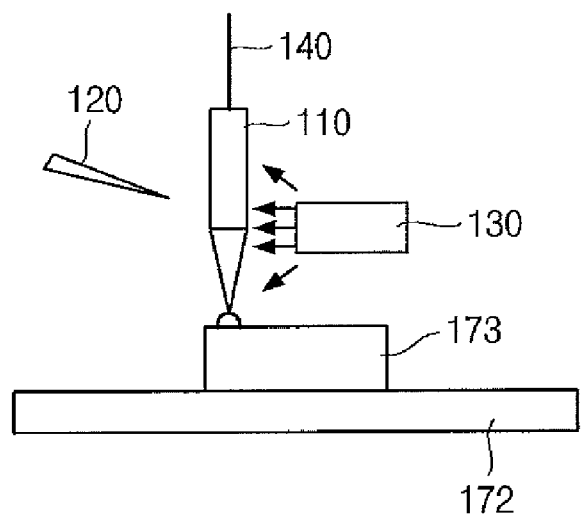

As illustrated in FIG. 4C, and in step S3 of FIG. 3, the free air ball of the conductive wire 140 is primarily bonded to the semiconductor die 173 (ball bonding). Specifically, the capillary 110 descends toward the semiconductor die 173, and then ultrasonic energy is delivered to the capillary 110 in a state where the free air ball is pressed against a bond pad of the semiconductor die 173 to bond the free air ball of the conductive wire 140 to the bond pad of the semiconductor die 173.

Figure 4D:
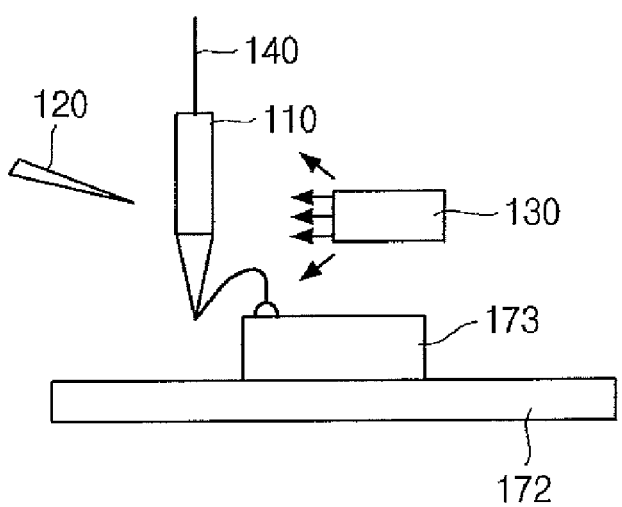

As illustrated in FIG. 4D, and in step S4 of FIG. 3, the capillary 110 moves toward the circuit board 172 (looping).

Figure 4E:
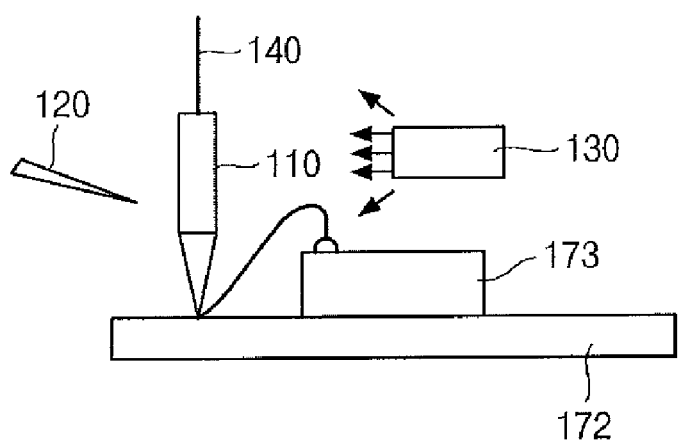

As illustrated in FIG. 4E, and in step S5 of FIG. 3, the distal end of the conductive wire 140 is secondarily bonded to the circuit board 172 (stitch bonding). Specifically, the capillary 110 is moved toward the circuit board 172, and then ultrasonic energy is delivered to the capillary 100 in a state in which the distal end of the conductive wire 140 is pressed against a circuit pattern of the circuit board 172 to bond the distal end of the conductive wire 140 to the circuit pattern.

The following table shows changes in the hardness of the copper wire and the free air ball. The hardness tests were conducted at various temperatures between 100 to 250° C. From the results in the table, it can be confirmed that the copper wire had a hardness of 65 to 75 Hv at room temperature, 31 Hv at 100° C. and 20 Hv at 250° C. In addition, the free air ball was found to have a hardness of 45 to 55 Hv at room temperature. These results indicate that the free air ball will have lower hardness values at 100° C. and 250° C. than the hardness at room temperature.

| | | Cu wire | | |
|---|---|---|---|---|
| Wire diameter: 1.0 mil | | Room Temp. | 100° C. | 250° C. |
| Hardness (Hv) | FAB | 45-55 | | |
| | Wire | 65-75 | 31 | 20 |

Figure 5A:
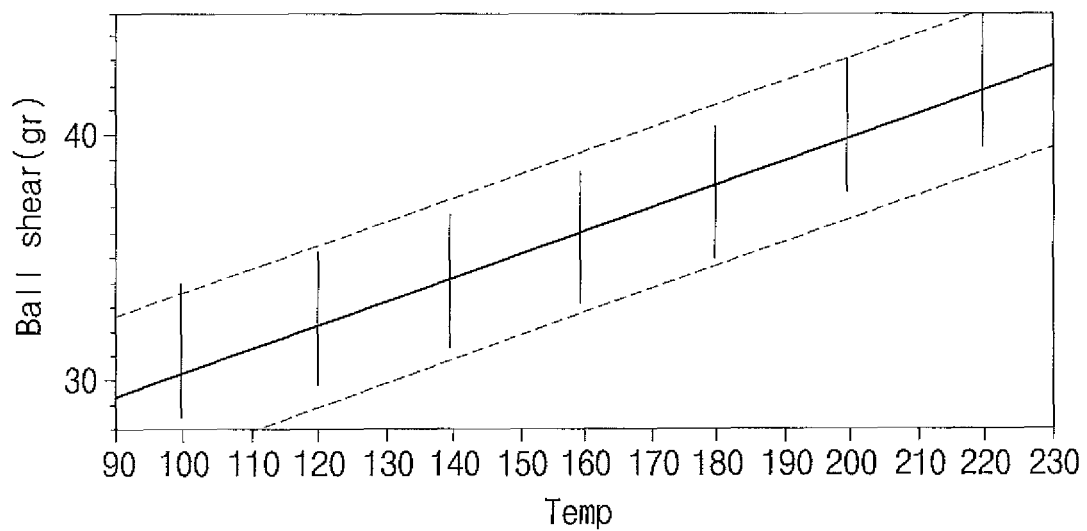
FIGS. 5A and 5B are graphs showing changes in ball shear and stitch pull with increasing temperature of a conductive wire after wire bonding in accordance with the present invention, respectively.
Figure 5B:
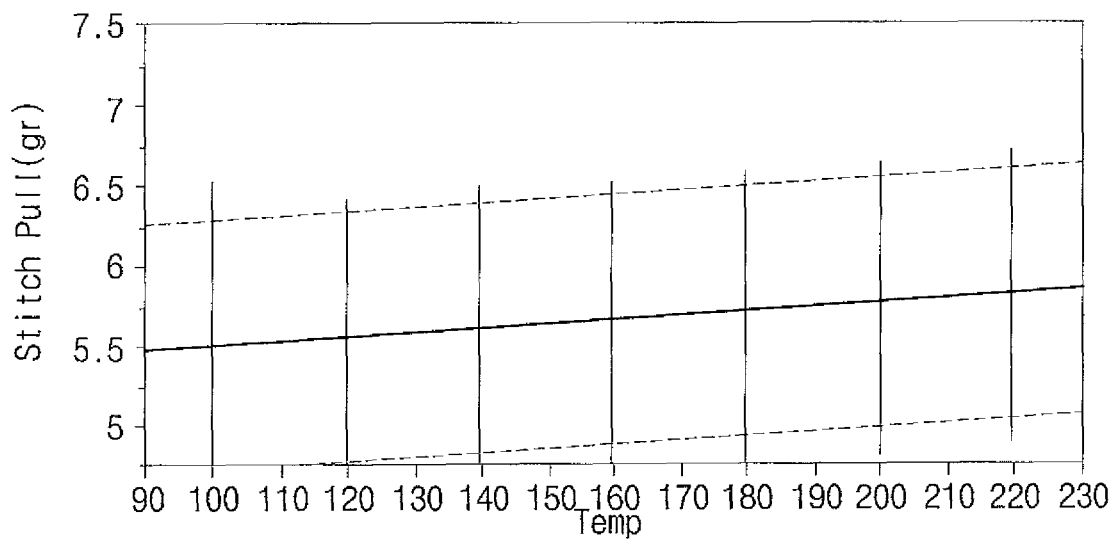

Referring to FIGS. 5A and 5B, there are shown changes in ball shear and stitch pull versus temperature of the conductive wire 140 after wire bonding in accordance with the present invention, respectively. The temperatures of the hot forming gas supplied by the gas diffuser were varied from about 90° C. to about 230° C. while maintaining the temperature of the heater block at 100° C.

The x- and y-axis in FIG. 5A show temperature and ball shear, respectively. The ball shear of the conductive wire was determined by measuring a force applied when the ball bonding region of the conductive wire formed on the bond pad was pushed in the lateral direction using a tool equipped with a sensor until the ball bonding region was separated from the bond pad. As illustrated in FIG. 5A, the ball shear increased by about 0.9 gr whenever the temperature of the hot forming gas was raised by about 10° C. In conclusion, the supply of the hot forming gas during wire bonding increased the ball shear of the conductive wire in the ball bonding region with increasing temperature.

Referring to FIG. 5B, the x- and y-axis in FIG. 5B show temperature and stitch pull, respectively. The stitch pull of the conductive wire was determined by measuring a force applied when a hook equipped with a sensor was tied to the conductive wire after wire bonding and was then raised at a predetermined speed until the wire was cut. As illustrated in FIG. 5B, the stitch pull increased by about 0.02 gr whenever the temperature of the hot forming gas was raised by about 10° C. In conclusion, the supply of the hot forming gas during wire bonding increased the stitch pull of the conductive wire with increasing temperature.

Figure 6:
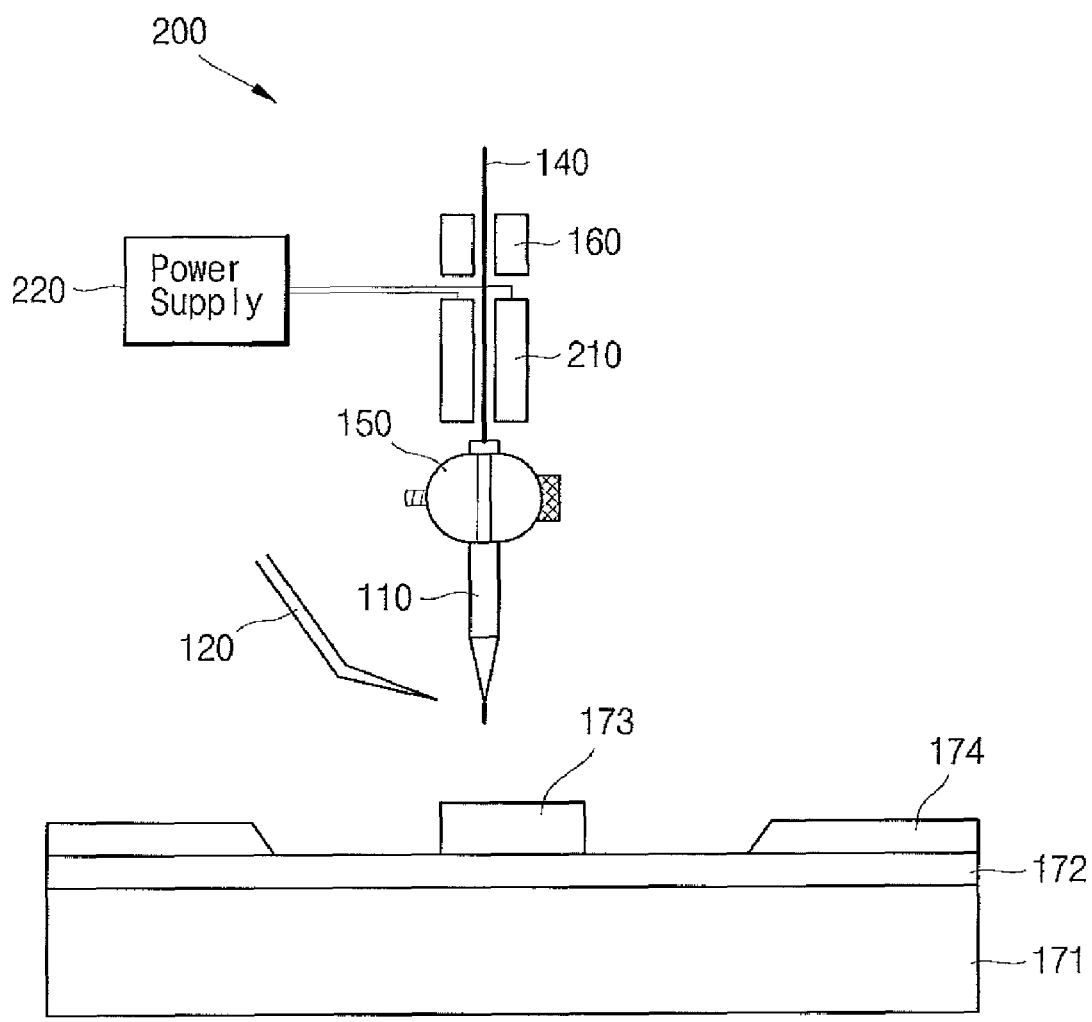
FIG. 6 is a schematic view illustrating the construction of a wire bonder according to a further embodiment of the present invention.

Referring to FIG. 6, a schematic view of a wire bonder 200 according to a further embodiment of the present invention is shown. As illustrated in FIG. 6, the wire bonder 200 comprises a capillary 110, an electric flame-off tip 120 and a heater 210.

A conductive wire 140 penetrates the capillary 110. A transducer 150 is coupled to the capillary 110 to deliver ultrasonic energy to the capillary 110. A clamp 160 is installed above the capillary 110 to clamp or unclamp the conductive wire 140. A heater block 171, a circuit board 172, a semiconductor die 173 and a clamp 174 pressing the circuit board 172 are installed below the capillary 110.

The heater 210 is positioned between the clamp 160 and the capillary 110 and has a substantially circular tubular shape. The conductive wire 140 penetrates the heater 210 and is heated by the heater 210. The heater 210 may take on a plurality of forms. For example, the heater 210 may be a thermoelectric element. However, this is given as an example and should not be seen to limit the scope of the present invention. A power supply unit is connected to the heater 210 to supply power to the heater 210. In the present embodiment, the heater 210 provides a temperature of 25 to 300° C. to the conductive wire 140. As a result, the heat energy provided by the heater 210 enables effective wire bonding and improves the bondability of the conductive wire.

Figure 7:
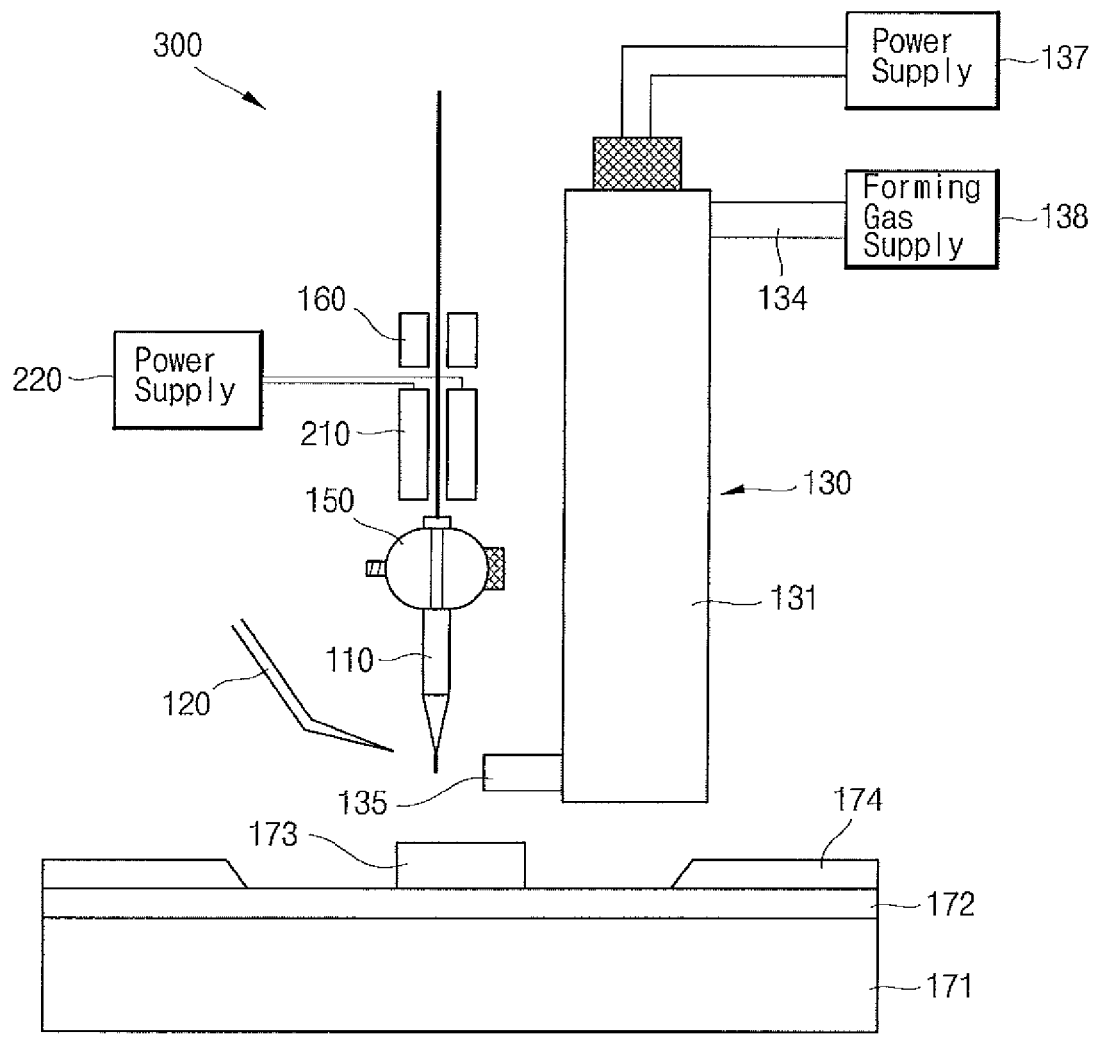
FIG. 7 is a schematic view illustrating the construction of a wire bonder according to another embodiment of the present invention.

Referring to FIG. 7, a schematic view of a wire bonder 300 according to another embodiment of the present invention is shown. As illustrated in FIG. 7, the wire bonder 300 may comprise a capillary 110, a gas diffuser 130 for supplying a hot forming gas to a free air ball created at the lower end of the capillary 110, and a heater 210 positioned above the capillary 110 to heat a conductive wire 140. Due to this construction, the hot forming gas is directly diffused to the free air ball to improve the ball shear or stitch pull of the conductive wire 140. In addition, the conductive wire 140 penetrating the capillary 110 is preheated to achieve improved bondability upon wire bonding.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A wire bonder comprising:
   a capillary through which a wire passes,
   a discharge tip positioned near a bottom section of the capillary and providing a flame to a distal end of the wire; and
   a gas diffuser positioned beside the capillary to diffuse a heated gas to the distal end of the wire, wherein the gas diffuser comprises:
   a body having an open space formed in an interior section and running a length of the body;
   an inlet port formed in the body and in flow communication with the open space;
   an outlet port formed in the body and in flow communication with the open space;
   a heater inserted into the open space;
   a gas supply connected to the inlet port; and a helical groove formed along an inner diameter surface of the open space in the body, the helical groove extending approximately from the inlet port to the outlet port;

wherein the heater is inserted into the open space to form a gap between the heater and the helical groove, the heated gas flowing downwardly along the helical groove.

2. The wire bonder of claim 1, further comprising a power supply coupled to the heater.

3. The wire bonder of claim 1, wherein the gas diffuser provides the heated gas at a temperature of approximately 25 to 300° C.

4. The wire bonder of claim 1, wherein the heated gas is one of: nitrogen, hydrogen, air and mixtures thereof.

5. The wire bonder of claim 1, wherein the wire is made of a conductive material selected from one of: copper, gold and aluminum.

6. The wire bonder of claim 1, further comprising a wire heater positioned above the capillary to heat the wire, wherein the wire runs through the wire heater to enable heating of sections of the wire that pass through the wire heater.

7. The wire bonder of claim 6, wherein the heater is a thermoelectric element.

8. The wire bonder of claim 6, further comprising a power supply unit coupled to the heater.

9. The wire bonder of claim 5, wherein the heater warms the wire to approximately 25 to 300° C.

10. A wire bonder comprising
   a capillary through which a conductive wire passes;
   a wire heater positioned above the capillary to heat the conductive wire;
   a discharge tip positioned near a bottom section of the capillary and providing a flame to a distal end of the conductive wire; and
   a gas diffuser positioned beside the capillary to diffuse a heated gas to the distal end of the wire, wherein the gas diffuser comprises:
   a hollow body having an inlet port at a first end of the hollow body and an outlet port at a second end of the hollow body;
   a heater inserted into an open space within the hollow body;
   a gas supply connected to the inlet port; and
   a helical groove formed along an inner diameter surface of the open space in the hollow body, the helical groove extending approximately from the inlet port to the outlet port;
   wherein the heater is inserted into the open space to form a gap between the heater and the helical groove, the heated gas flowing downwardly along the helical groove.

11. The wire bonder of claim 10, wherein the wire heater is a thermoelectric element.

12. The wire bonder of claim 10, wherein the wire heater heats the conductive wire to a temperature of approximately 25 to 300° C. to the conductive wire.

13. A wire bonder comprising
   a capillary through which a conductive wire passes;
   means positioned above the capillary for heating the conductive wire;
   means positioned near a bottom section of the capillary for providing a flame to a distal end of the wire; and
   means positioned beside the capillary for diffusing a heated gas to the distal end of the wire, wherein the means for diffusing a heated gas comprises:
   a hollow body having and inlet port and an outlet port;
   a heater inserted into an open space within the hollow body;
   a gas supply connected to the inlet port; and
   a helical groove formed along an inner diameter surface of the open space in the hollow body, the helical groove extending approximately from the inlet port to the outlet port;
   wherein the heater is inserted into the open space to form a gap between the heater and the helical groove, the heated gas flowing downwardly along the helical groove.

14. The wire bonder of claim 13, wherein the heated gas is one of: nitrogen, hydrogen, air and mixtures thereof.

15. The wire bonder of claim 13, wherein the means for heating the conductive wire heats the conductive wire to a temperature of approximately 25 to 300° C.

* * * * *